United States Patent
Tan et al.

(10) Patent No.: US 7,057,962 B1
(45) Date of Patent: Jun. 6, 2006

(54) ADDRESS CONTROL FOR EFFICIENT MEMORY PARTITION

(75) Inventors: Johnson Tan, San Jose, CA (US);
Chiakang Sung, Milpitas, CA (US);
Philip Pan, Fremont, CA (US); Yan Chong, Mountain View, CA (US);
Joseph Huang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/806,638

(22) Filed: Mar. 22, 2004

(51) Int. Cl.
*G11C 8/00* (2006.01)

(52) U.S. Cl. .......................... 365/230.05; 365/230.01; 365/230.02; 365/189.04; 365/189.12

(58) Field of Classification Search ........... 365/230.05, 365/230.01, 230.02, 189.04, 189.12
See application file for complete search history.

(56) References Cited

U.S. PATENT DOCUMENTS 5,325,332 A * 6/1994 Tagaya .................. 365/200

* cited by examiner

*Primary Examiner*—Richard Elms
*Assistant Examiner*—Pho M. Luu
(74) *Attorney, Agent, or Firm*—Townsend and Townsend and Crew LLP

(57) ABSTRACT

A memory cell of a programmable device includes a memory partitioning circuit to partition a multiple port memory device into one or more single port memory partitions. The memory partitioning circuit prevents cross addressing by setting the value of one or more address lines of each memory port to a fixed value. The memory partitioning circuit holds address lines at their required values during the programmable device's normal, clear, and reset modes of operation. The behavior of the memory partitioning circuit is set by a portion of a device configuration used to configure the programmable device. The memory partitioning circuit is connected between a memory cell's address register and row or column decoders used to access the multiple port memory device. The memory partitioning circuit can also perform bit-wise inversion operations on portions of the memory addresses.

23 Claims, 6 Drawing Sheets

ADDRESS CONTROL FOR EFFICIENT MEMORY PARTITION

BACKGROUND OF THE INVENTION

The present invention relates to the field of programmable devices, and the systems and methods for programming the same. Programmable devices, such as FPGAs, typically includes thousands of programmable logic cells that use either a combination of logic gates or a look-up table to perform a logic operation. Programmable devices also include a number of functional cells having specialized devices adapted to a specific operations, including memory cells adapted to store information, multiply and accumulate (MAC) cells adapted to perform arithmetic operations, and communication cells adapted to communicate with external devices.

The logic cells and functional cells are interconnected with a configurable switching circuit. The configurable switching circuit selectively routes connections between the logic cells and functional cells. By configuring the combination of logic cells, functional cells, and the switching circuit, a programmable device can be adapted to perform virtually any type of information processing function. The configuration of the logic cells, functional cells, and the switching cells, referred to as the device configuration, is stored in a configuration memory included in the programmable device. The device configuration can be loaded from an external device, such as an external non-volatile memory device or a testing device, into the configuration memory of the programmable device, thereby configuring the programmable device to perform the desired function.

The memory cells of a programmable device can be implemented as a multiple port random-access memory (RAM) device. A multiple port RAM device allows several memory read or write operations to occur simultaneously. For example, a dual-port RAM device allows for two simultaneous memory operations. Similarly, a four-port RAM device allows for four simultaneous memory operations. Typically, each port of a multiple port memory cell will have its own data and address lines.

To allow for greater flexibility in utilizing memory cells, a multiple-port memory cell can be partitioned by a device configuration into several single port memory devices. For example, a dual-port memory cell can be partitioned into two single-port memory devices. In general, an M-port memory cell can be partitioned into as many as M single port memory devices. Partitioning a memory cell allows for a greater variety of data to be stored in a memory cell without requiring complicated memory management schemes.

When a memory cells in partitioned in several single port memories, care must be taken so that data intended for one partition is not inadvertently stored in a portion of the memory cell assigned to another partition. This problem, referred to as cross-addressing, can be prevented by aligning memory partitions along memory address boundaries and assigning fixed values to some of the address lines of each port. By fixing the values of some its address lines, a port cannot access the portion of a memory cell outside of its assigned partition. The fixed values assigned to address lines of each port of a memory cell are typically set by the configuration data of the programmable device, and must remain at their assigned values during the programmable device's reset and clear operations, as well as during the programmable device's normal operation.

A prior implementation for partitioning a multiple port memory cell into one or more single port memory partitions uses the programmable device's logic cells to drive the desired fixed values onto the address lines of each memory port of the memory cell. This implementation typically requires a separate logic cell for each address line to be fixed. Additionally, each logic cell used for memory partitioning must be connected with the appropriate address line via the configurable switching circuit. As a programmable device has only a limited number of logic cells available and the configurable switching circuit has a limited capacity to route connections within the programmable device, the use of logic cells to partition memory cells wastes precious programmable device resources.

It is therefore desirable to enable a programmable device to divide multiple port memory cells into one or more single port memory partitions without consuming expensive programmable device resources and while preventing cross addressing problems. It is further desirable that the memory partitioning specified by a device configuration remains in effect during all modes of operation of the programmable device, including reset and clear operation. It is additionally desirable for more complicated memory addressing functions, such as address bit inversions, to be enabled without requiring expensive programmable device resources.

BRIEF SUMMARY OF THE INVENTION

A memory cell of a programmable device includes a memory partitioning circuit to partition a multiple port memory device into one or more single port memory partitions. The memory partitioning circuit prevents cross addressing by setting the value of one or more address lines of each memory port to a fixed value. The memory partitioning circuit holds address lines at their required values during the programmable device's normal, clear, and reset modes of operation. The behavior of the memory partitioning circuit is set by a portion of a device configuration used to configure the programmable device. The memory partitioning circuit is connected between a memory cell's address register and row or column decoders used to access the multiple port memory device. The memory partitioning circuit can also perform bit-wise inversion operations on portions of the memory addresses.

In an embodiment, a memory cell of a programmable device includes a memory device having a set of memory ports. Each memory port is adapted to access to the memory device. An address register has a plurality of sets of address lines. Each set of address lines is adapted to communicate a memory address with one of the set of memory ports. A memory partitioning set includes at least one memory partitioning circuit. The memory partitioning circuit is connected between an address line of one of the sets of address lines and a corresponding input of one of the set of memory ports. The memory partitioning circuit includes a first operation mode adapted to hold the corresponding input of one of the set of memory ports to a fixed value and a second operation mode adapted to pass the value of the connected address line to the corresponding input of one of the set of memory ports.

In an additional embodiment, the memory partitioning set includes a first memory partitioning circuit, which is connected with a first address line of the address register and an input of a first memory port of the memory device, and a second memory partitioning circuit, which is connected with a second address line of the address register and an input of a second memory port of the memory device. The first and second memory partitioning circuits are adapted to hold the inputs of their respective memory ports of the memory device to complementary values, thereby dividing the memory device into at least two single port memory partitions.

In a further embodiment, a memory partitioning circuit of the memory partitioning set includes a third operation mode adapted to invert the value of an address line of one of the sets of address lines.

In yet another embodiment, at least one of the memory partitioning circuits of the memory partitioning set is responsive to a programmable device configuration specifying the mode of operation of the memory partitioning circuit.

BRIEF DESCRIPTION OF THE DRAWINGS

The invention will be described with reference to the drawings, in which.

In the drawings, the use of like reference numbers indicates like components.

DETAILED DESCRIPTION OF THE INVENTION

Figure 1:
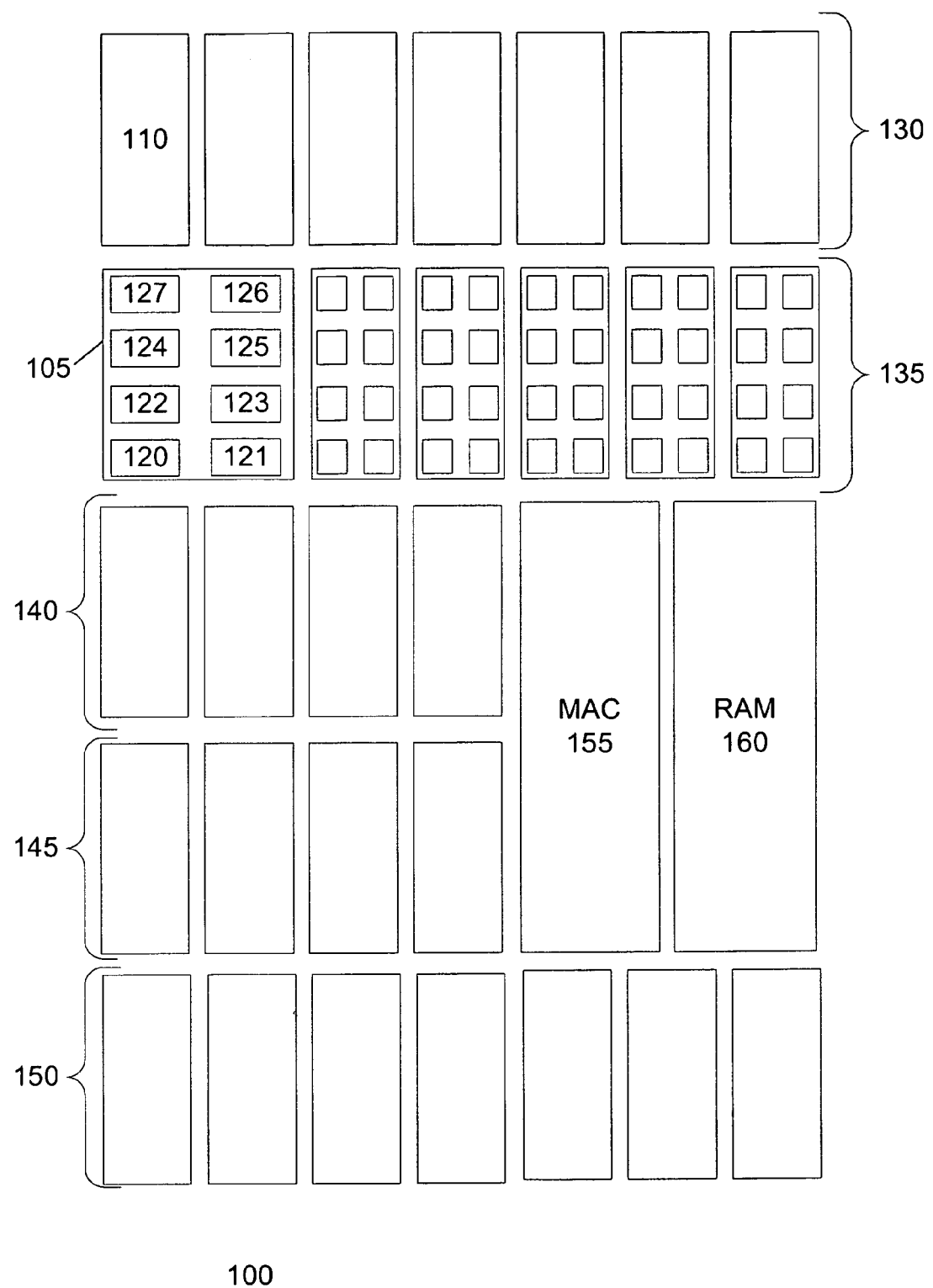
FIG. 1 illustrates a portion of an example programmable device suitable for implementing an embodiment of the invention.

FIG. 1 illustrates a portion of an example programmable device 100 suitable for use with an embodiment of the invention. Programmable device 100 includes a number of logic blocks, such as logic blocks 105, 110, 115. Each logic block includes a number of programmable logic cells using logic gates and/or look-up tables to perform a logic operation. Logic block 105 illustrates in detail logic cells 120, 121, 122, 123, 124, 125, 126, and 127. Logic cells are omitted from the other logic blocks in FIG. 1 for clarity. The logic blocks of device 100 are arranged into rows 130, 135, 140, 145, and 150. In an embodiment, the arrangement of logic cells within a logic cell and of logic cells within rows provides a hierarchical system of configurable connections, in which connections between logic cells within a logic cell, between cells in different logic cells in the same row, and between cell in logic cells in different rows require progressively more resources and operate less efficiently.

In addition to logic cells arranged in logic blocks, programmable device 100 also include specialized functional blocks, such as multiply and accumulate block (MAC) 155 and random access memory block (RAM) 160. For clarity, the portion of the programmable device 100 shown in FIG. 1 only includes a small number of logic cells, logic blocks, and functional blocks. Typical programmable devices will include hundreds or thousands of these elements.

Figure 2:
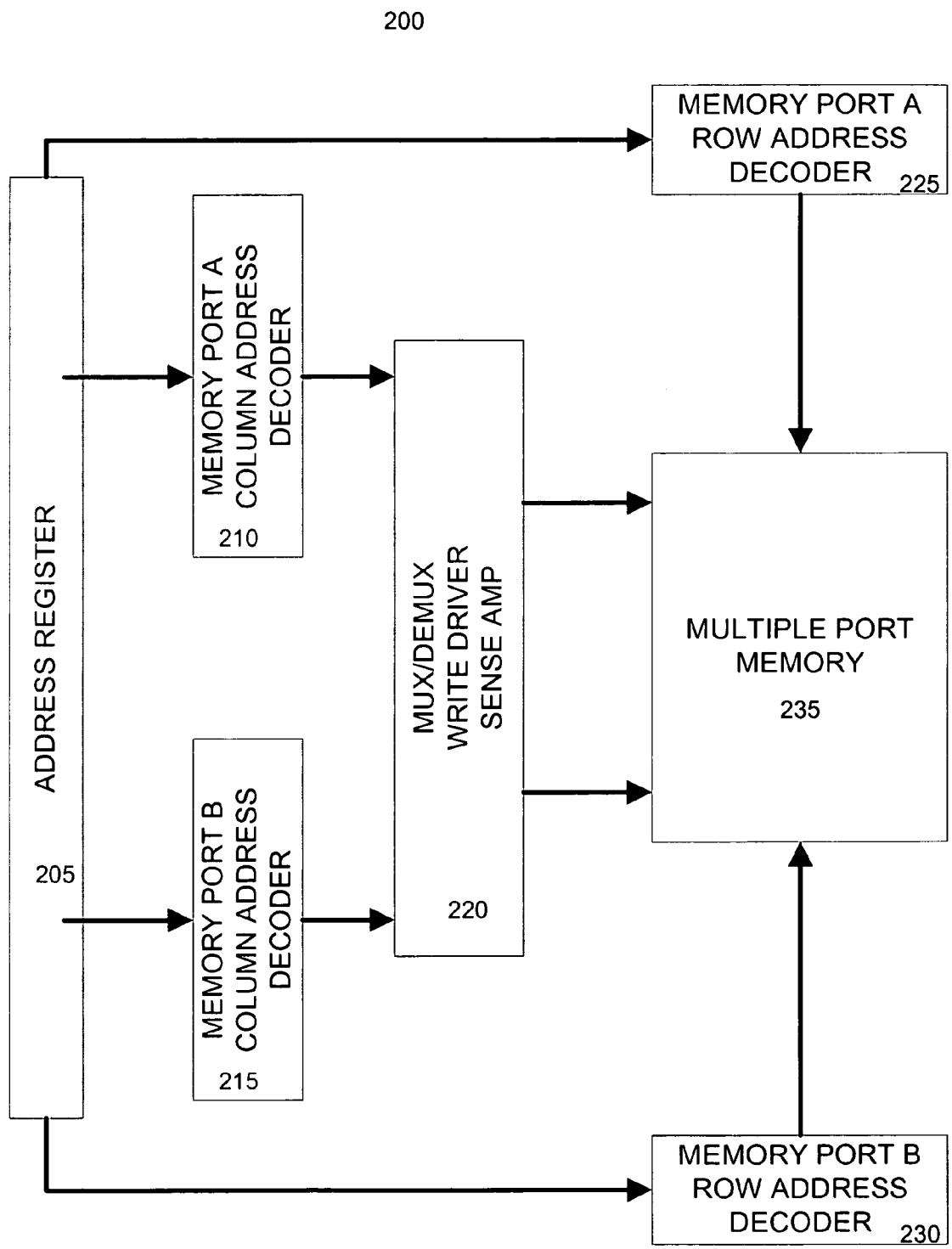
FIG. 2 illustrates an example multiple port memory cell suitable for implementing an embodiment of the invention.

FIG. 2 illustrates an example multiple port memory cell 200 suitable for implementing an embodiment of the invention. Memory cell 200 includes a multiple port memory device 235, for example a dual port RAM device. Alternate embodiments of the invention can be implemented with memory devices having more than two ports. Each memory port has a corresponding data output from memory device 235, which is omitted from FIG. 2 for clarity. An address register 205 stores memory addresses used to access the multiple port memory 235. For a dual port memory, address register 205 stores two memory address, one for each memory port. In this example, memory cell 200 can read or write simultaneously to the two memory addresses stored in address register 205.

Address register 205 is connected with a first memory port, hereafter referred to as Port A, and a second memory port, hereafter referred to as Port B. A first portion of the address bits for Port A stored in address register 205 are connected with row address decoder 225. Row address decoder 225 uses the first portion of the address bits to select a row of the multiple port memory to be accessed by Port A. A second portion of the address bits for Port A are stored in the address register 205 are connected with column address decoder 210. This second portion of the address bits for Port A are used by the column address decoder to select a column of the multiple port memory 235 to be accessed by Port A. The output of the column address decoder 210 is connected with multiplexer/demultiplexer, write driver, and sense amp stage 220, which is used to drive the selected column of the multiple port memory 235, and read data from or write data to multiple port memory 235.

Similarly, a first portion of the address bits for Port B stored in address register 205 are connected with row address decoder 230. Row address decoder 230 uses the first portion of the address bits to select a row of the multiple port memory to be accessed by Port B. A second portion of the address bits for Port B stored in the address register 205 are connected with column address decoder 215. This second portion of the address bits for Port B are used by the column address decoder to select a column of the multiple port memory 235 to be accessed by Port B. The output of the column address decoder 215 is connected with multiplexer/demultiplexer, write driver, and sense amp stage 220, which is used to drive the selected column of the multiple port memory 235, and read data from or write data to multiple port memory 235.

Figure 3:
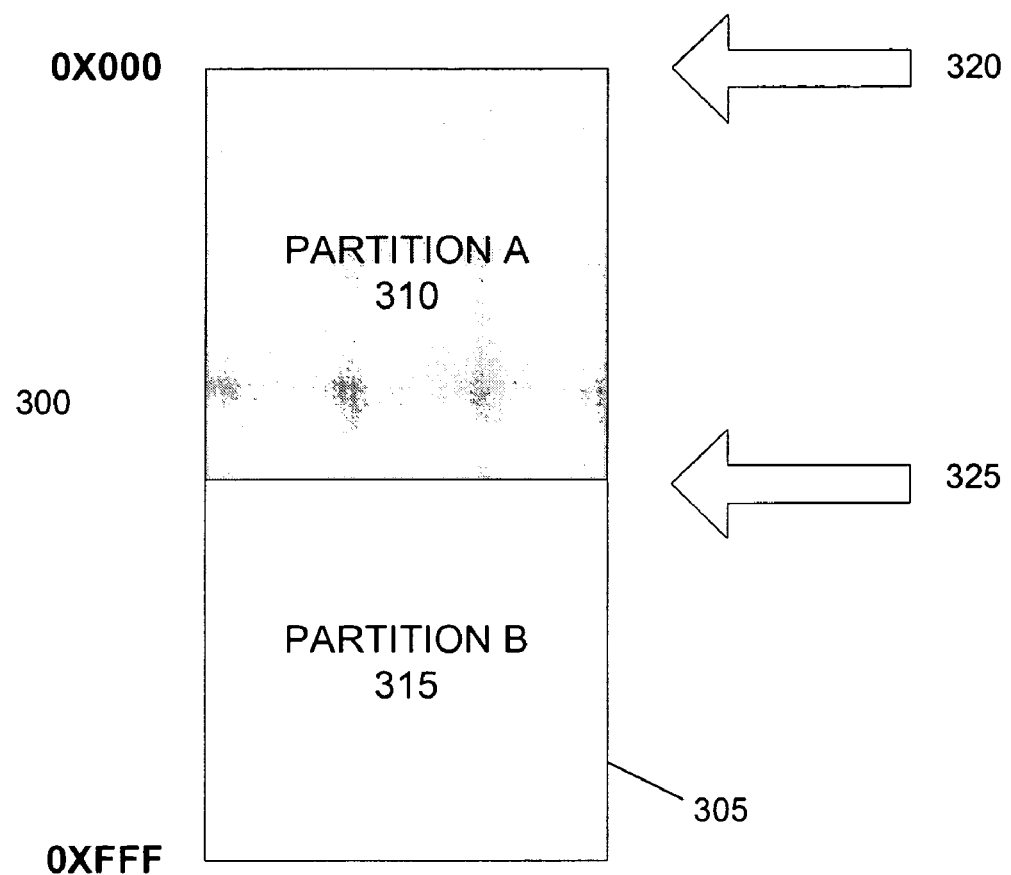
FIG. 3 illustrates an example set of single port memory partitions of memory cell capable of being implemented by an embodiment of the invention.

FIG. 3 illustrates an example set 300 of single port memory partitions of memory cell capable of being implemented by an embodiment of the invention. The set 300 of memory partitions 300 are illustrated by memory map 305 showing the address space of a memory cell. Memory map 305 had been divided into two partitions 310 and 315, associated with memory ports A and B respectively. Partitions 310 and 315 are defined by base addresses 320 and 325. In an embodiment, the base address of each partition are defined by fixing the value of one or more address lines of each memory port. For example, setting the high order address line to 0 for Port A and to 1 for Port B will divide the address space into two equally sized partitions. Alternatively, additional address lines can be set to fix values for one or more ports to divide the address space into unequally sized partitions. In a further variation, one or more low order address lines can be set to interleave the partitions in the address space, for example, assigning all odd memory addresses to partition 310 and all even memory address to partition 315.

Figure 4:
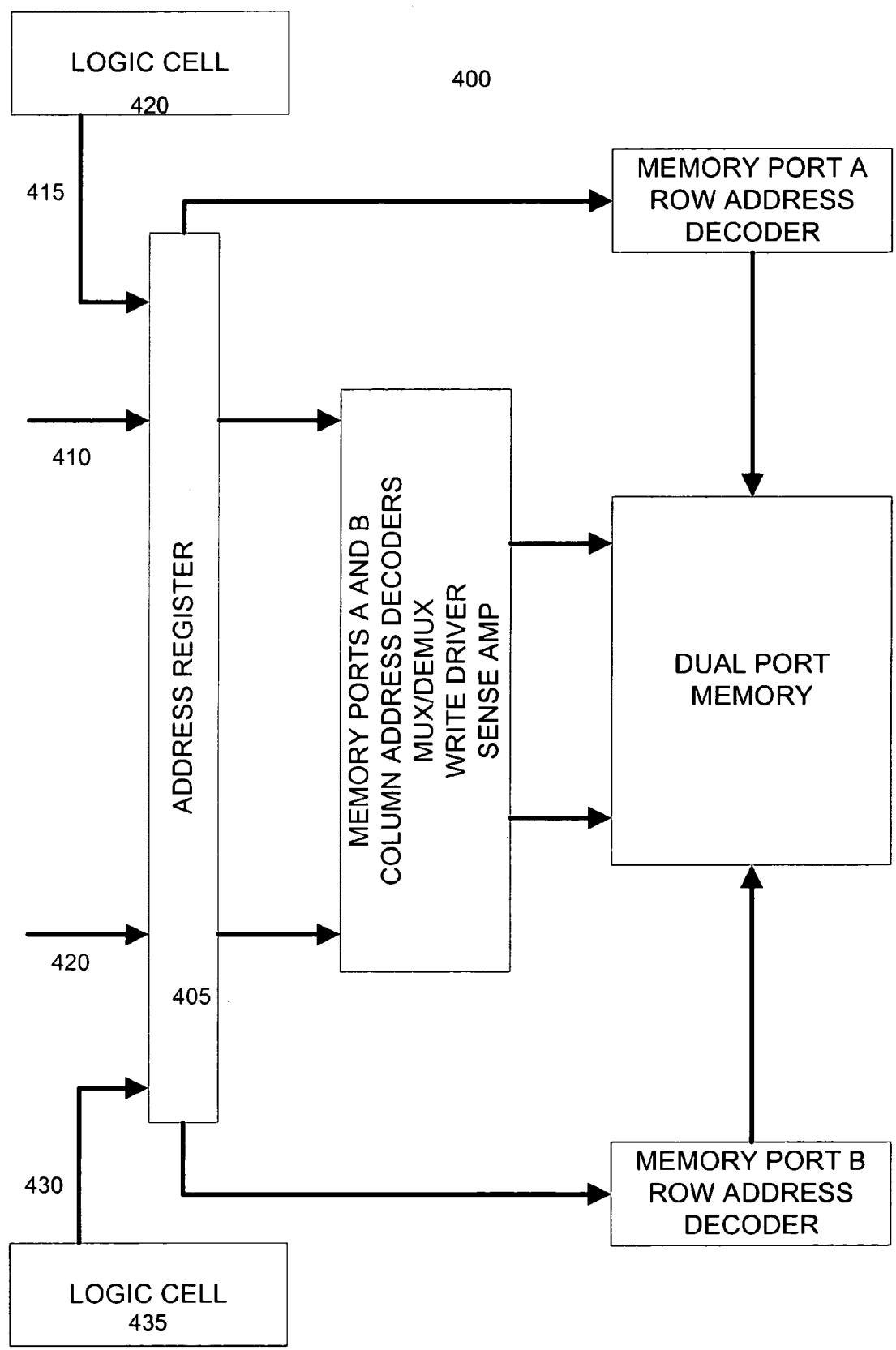
FIG. 4 illustrates a prior implementation for dividing a multiple port memory cell into one or more single port memory partitions.

Regardless of the number of memory partitions and their relative sizes and arrangements within the memory device, the values of at least a portion of each port's address lines must be fixed to prevent cross addressing. FIG. 4 illustrates a prior implementation 400 for dividing a multiple port memory cell into one or more single port memory partitions. Implementation 400 uses the programmable device's logic cells to maintain fixed values on a portion of each port's address lines during normal device operation, as well as during the programmable device's reset and clear modes.

Address register 405 receives memory addresses for Ports A and B from other portions of the programmable device. For Port A, the value of a portion 410 of the address lines are free to be set to any value by the programmable device. A second portion 415 of the address lines of Port A are connected with logic cell 420, which holds the second portion 415 of address lines of Port A to a fixed value. Similarly, the value of a portion 420 of the address lines of Port B are free to be set to any value by the programmable device. A second portion 430 of the address lines of Port B are connected with logic cell 435, which holds the second portion 425 of the address lines of Port B to a fixed value.

As discussed above, using logic cells to set the value of a portion of the address lines for each port of a partitioned multiple port memory cell wastes limited programmable device resources. To address this problem, an embodiment of the invention prevents cross addressing of memory partitions without consuming limited programmable device resources.

Figure 5:
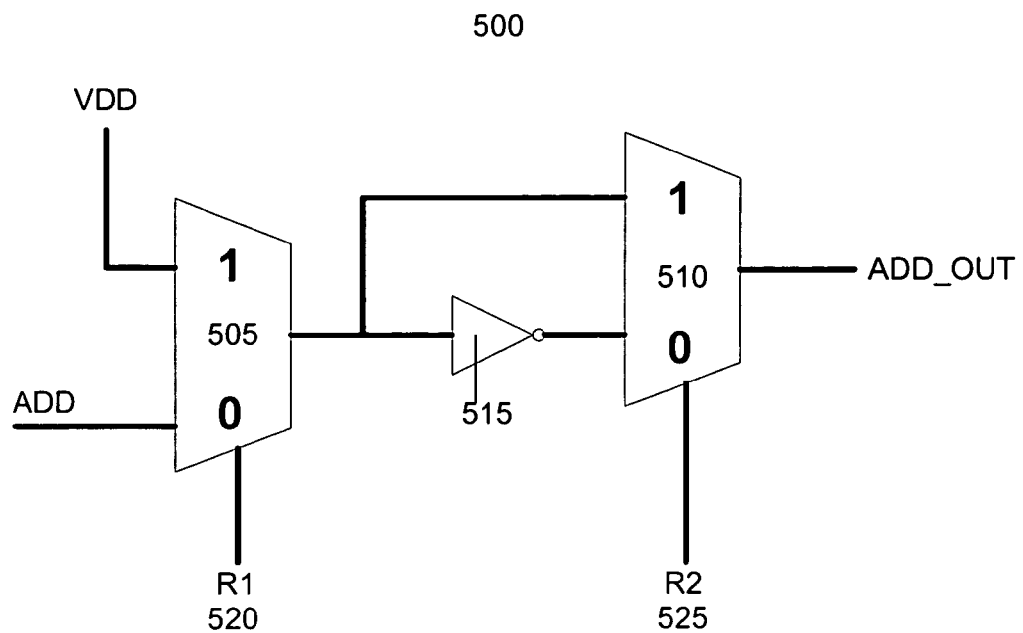
FIG. 5 illustrates a memory partitioning circuit for an address line according to an embodiment of the invention.

FIG. 5 illustrates a memory partitioning circuit 500 for an address line according to an embodiment of the invention. In an embodiment, the memory partition circuit 500 is connected with an address line output from the address register, such as address register 205 discussed above, and with the input of a row or column decoder of the memory cell. As discussed in detail below, the memory partitioning circuit can be incorporated into the address register, such as address register 205.

In an embodiment, memory partitioning circuit 500 includes multiplexers 505 and 510, as well as inverter 515. Multiplexers 505 and 510 are controlled by inputs R1, 520, and R2, 525, respectively. Inputs R1, 520, and R2, 525, are in turn connected with the configuration memory of the programmable device. As the device configuration is loaded into the configuration memory of the programmable device, the values of inputs R1, 520, and R2, 525, are set to the appropriate values, discussed in detail below. The configuration memory output is unchanged during normal operation of the programmable device, as well as during reset or clear operations, ensuring that the memory partitioning circuit 500 maintains the required fixed value on the address line at all times.

In accordance with the value of input R1, 520, the output of multiplexer 505 is selected as either the value of the address line from the address register or the value of VDD, the logic high voltage. The output of multiplexer 505 is then input to multiplexer 510 as both its normal and inverted value. The output of multiplexer 510 is selected by input R2, 525, to be either the normal or inverted value of the output of the multiplexer 505. The output of multiplexer 510 is connected with the row or column address decoder associated with the address line from address register.

Table 1 illustrates the different modes of operation for the memory partitioning circuit 500. Depending upon the values of the inputs R1, 520, and R2, 525, the memory partitioning circuit can set the address line to a fixed value of 0 or 1, can pass through the value of the address line of the address register unchanged, or can invert the value of the address line from the address register.

TABLE 1

Operation of the Memory Partitioning Circuit

| R2 | R1 | OUTPUT | NOTES |
|----|----|--------|-------|
| 0 | 0 | !INPUT | BIT INVERSION ENABLED |
| 0 | 1 | 0 | ADDRESS LINE FIXED TO 0 |
| 1 | 0 | INPUT | NO BIT INVERSION |
| 1 | 1 | 1 | ADDRESS LINE FIXED TO 1 |

Figure 6:
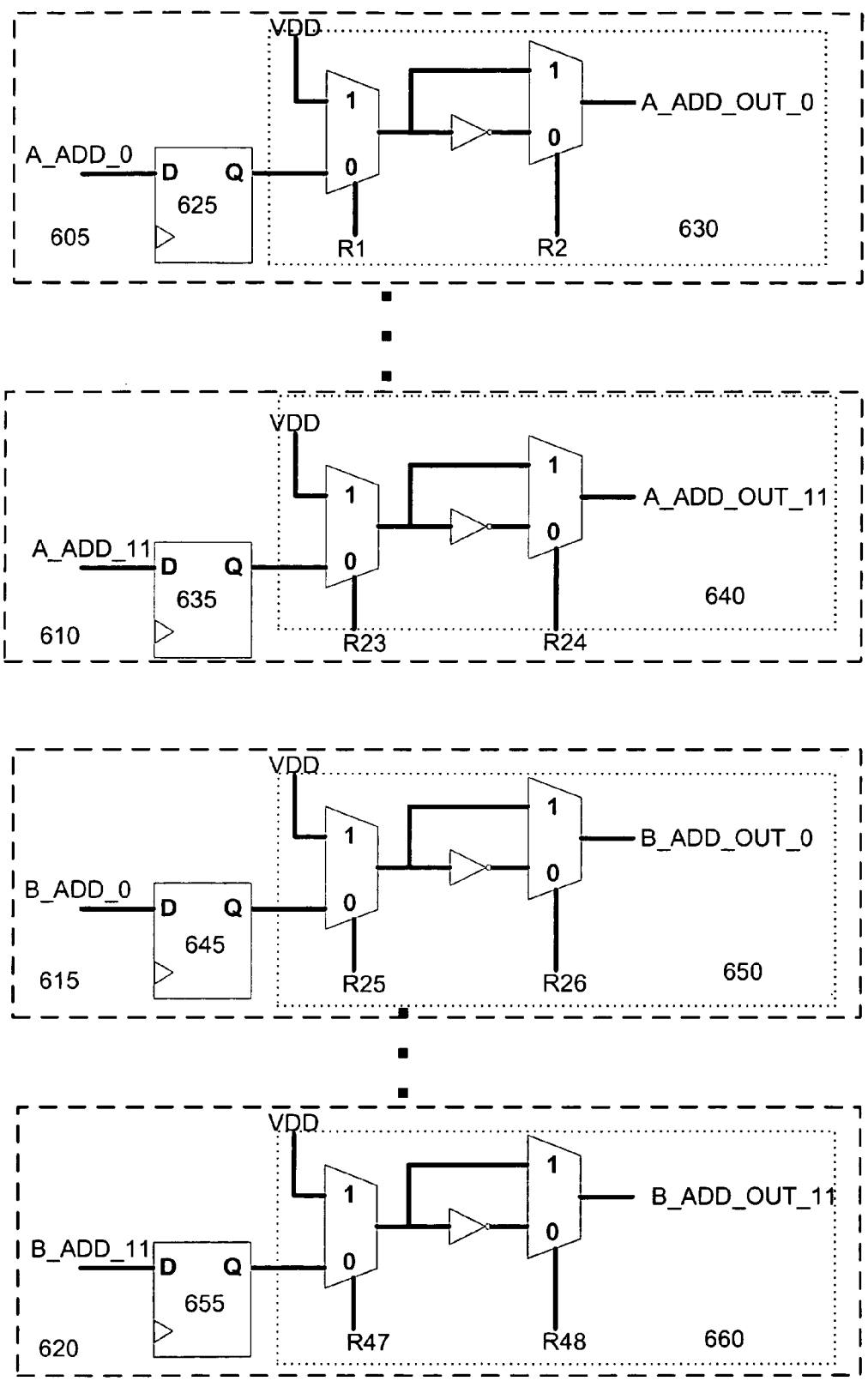
FIG. 6 illustrates an address register of a memory cell according to an embodiment of the invention.

The memory partitioning circuit 500 can be integrated into the address register 205 of the memory cell 200. FIG. 6 illustrates an address register of a memory cell according to an embodiment of the invention. In this embodiment, each address line of the address register is connected with a memory partitioning circuit, enabling the value of any address line to be set to a fixed value, to be inverted, or to be passed through unchanged. In alternate embodiment, only a portion of address lines of the address register are connected with a memory partitioning circuit.

In the example of FIG. 6, the address register 205 holds a twelve bit memory address for each of two memory ports used to access a memory device. Alternate embodiments of the invention are adaptable to memory addresses of any size. The first bit 605 of the memory address for port A. The first bit 605 includes a latch or flip-flop 625 for receiving a first address bit value from other portions of the programmable device.

The output of the flip-flop 625 is connected with a memory partitioning circuit 630. In an embodiment, the memory partitioning circuit 630 is similar to the memory partitioning circuit 500 discussed above. The R1 and R2 inputs of memory partitioning circuit 630 are connected with the configuration memory of the programmable device. The output of the memory partitioning circuit 630 is connected with either a row or column address decoder of the memory cell, depending on the arrangement of the multiple port memory device in the memory cell.

In an embodiment, this arrangement of a flip-flop connected with a memory partitioning circuit is repeated for each bit of the address register 205 associated with Port A, up to and including the last bit 610 of Port A. The last bit 610 of Port A includes a flip-flop 635 and memory partitioning circuit 640. Memory partitioning circuit 640 includes inputs R23 and R24, which are connected with the configuration memory of the programmable device. In this example, odd numbered inputs, such as input R23, and even numbered inputs, such as R24, behave similarly to inputs R1 and R2, respectively.

The portion of the address register 205 for storing the memory address for Port B is similar to that of memory port A. Each bit of the memory address for Port B, such as the first bit 615 and the last bit 620, includes a flip-flop and a memory partitioning circuit. For example, the first bit 615 of the memory address for Port B includes flip-flop 645 and memory partitioning circuit 650. The last bit 620 of the memory address for Port B includes flip-flop 655 and memory partitioning circuit 660. The inputs of the memory partitioning circuits are connected with the configuration memory of the programmable device. As discussed above, the odd numbered inputs of the memory partitioning circuits, such as input R25, and even numbered inputs of the memory partitioning circuit, such as R26, behave similarly to inputs R1 and R2, respectively.

In the example of FIG. 6, address register 205 holds two memory addresses used to access a two port memory device.

An alternate embodiment of address register holds additional memory addresses for accessing a memory device with additional memory ports. In this alternate embodiment, additional address lines are connected with memory partitioning circuits in a similar manner to that described above, with addition connections with the configuration memory to control the memory partitioning circuits as required.

Further embodiments can be envisioned to one of ordinary skill in the art after reading the attached documents. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A memory cell comprising:
   a memory device having a set of memory ports, each memory port adapted to access to the memory device;
   an address register having a plurality of sets of address lines, each set of address lines adapted to communicate a memory address with one of the set of memory ports; and
   a memory partitioning set including at least one memory partitioning circuit, wherein the memory partitioning circuit is connected between an address line of one of the sets of address lines and a corresponding input of one of the set of memory ports, and wherein the memory partitioning circuit includes a first operation mode adapted to hold the corresponding input of one of the set of memory ports to a fixed value and a second operation mode adapted to pass the value of the connected address line to the corresponding input of one of the set of memory ports.

2. The memory cell of claim 1, wherein the memory partitioning set further comprises:
   a first memory partitioning circuit connected with a first address line of the address register and an input of a first memory port of the memory device;
   a second memory partitioning circuit connected with a second address line of the address register and an input of a second memory port of the memory device; and
   wherein the first and second memory partitioning circuits are adapted to hold the inputs of their respective memory ports of the memory device to complementary values, thereby dividing the memory device into at least two single port memory partitions.

3. The memory cell of claim 1, wherein at least one memory partitioning circuit of the memory partitioning set includes a third operation mode adapted to invert the value of an address line of one of the sets of address lines.

4. The memory cell of claim 1, wherein at least one of the memory partitioning circuits of the memory partitioning set is responsive to a programmable device configuration specifying the mode of operation of the memory partitioning circuit.

5. The memory cell of claim 1, wherein at least one memory partitioning circuit is comprised of at least one multiplexer and an inverter gate.

6. The memory cell of claim 1, wherein the multiple port memory device is a two port RAM device.

7. A programmable device comprising:
   a plurality of logic cells each adapted to perform a logic operation specified by a programmable device configuration;
   a configuration memory adapted to store a programmable device configuration; and
   at least one memory cell comprising:
   a memory device having a set of memory ports, each memory port adapted to access to the memory device;
   an address register having a plurality of sets of address lines, each set of address lines adapted to communicate a memory address with one of the set of memory ports; and
   a memory partitioning set of at least one memory partitioning circuit connected between an address line of one of the sets of address lines and a corresponding input of one of the set of memory ports, wherein the memory partitioning circuit includes a first operation mode adapted to hold the corresponding input of one of the set of memory ports to a fixed value and a second mode of operation adapted to pass the value of the connected address line to the corresponding input of one of the set of memory ports.

8. The programmable device of claim 7, wherein the memory partitioning set further comprises:
   a first memory partitioning circuit connected with a first address line of the address register and an input of a first memory port of the memory device;
   a second memory partitioning circuit connected with a second address line of the address register and an input of a second memory port of the memory device; and
   wherein the first and second memory partitioning circuits are adapted to hold the inputs of their respective memory ports of the memory device to complementary values, thereby dividing the memory device into at least two single port memory partitions.

9. The programmable device of claim 7, wherein at least one memory partitioning circuit of the memory partitioning set includes a third operation mode adapted to invert the value of an address line of one of the sets of address lines.

10. The programmable device of claim 7, wherein at least one of the memory partitioning circuits of the memory partitioning set is responsive to a programmable device configuration specifying the mode of operation of the memory partitioning circuit.

11. The programmable device of claim 7, wherein at least one memory partitioning circuit is comprised of at least one multiplexer and an inverter gate.

12. The programmable device of claim 7, wherein the multiple port memory device is a two port RAM device.

13. A system having a plurality of devices, the system comprising:
    a non-volatile memory device storing a programmable device configuration;
    a programmable device connected with the non-volatile memory device, the programmable device comprising:
    a plurality of logic cells each adapted to perform a logic operation specified by a programmable device configuration;
    a configuration memory adapted to store a programmable device configuration received from the non-volatile memory device; and
    at least one memory cell comprising:
    a memory device having a set of memory ports, each memory port adapted to access to the memory device;

an address register having a plurality of sets of address lines, each set of address lines adapted to communicate a memory address with one of the set of memory ports; and a memory partitioning set of at least one memory partitioning circuit connected between an address line of one of the sets of address lines and a corresponding input of one of the set of memory ports, wherein the memory partitioning circuit includes a first operation mode adapted to hold the corresponding input of one of the set of memory ports to a fixed value and a second mode of operation adapted to pass the value of the connected address line to the corresponding input of one of the set of memory ports.

14. The system of claim 13, wherein the memory partitioning set further comprises:

a first memory partitioning circuit connected with a first address line of the address register and an input of a first memory port of the memory device;

a second memory partitioning circuit connected with a second address line of the address register and an input of a second memory port of the memory device; and wherein the first and second memory partitioning circuits are adapted to hold the inputs of their respective memory ports of the memory device to complementary values, thereby dividing the memory device into at least two single port memory partitions.

15. The system of claim 13, wherein at least one memory partitioning circuit of the memory partitioning set includes a third operation mode adapted to invert the value of an address line of one of the sets of address lines.

16. The system of claim 13, wherein at least one of the memory partitioning circuits of the memory partitioning set is responsive to a programmable device configuration specifying the mode of operation of the memory partitioning circuit.

17. The system of claim 13, wherein at least one memory partitioning circuit is comprised of at least one multiplexer and an inverter gate.

18. The system of claim 13, wherein the multiple port memory device is a two port RAM device.

19. An information storage medium including a device configuration specifying a configuration of a programmable device, the device configuration comprising:

a first portion adapted to configure a plurality of logic cells of a programmable device to perform a plurality of logic operations;

a second portion adapted to configure a reconfigurable switching circuit of the programmable device to selectively route data connections between the plurality of logic cells; and a third portion adapted to configure a set of memory partitioning circuits associated with a memory cell of the programmable device, wherein each of the set of memory partitioning circuits has a first operation mode adapted to hold an input of a first memory port of a multiple port memory device of the memory cell to a fixed value and a second operation mode adapted to pass a value of an address line to the input of a first memory port of a multiple port memory device of the memory cell.

20. The information storage medium of claim 19, wherein the set of memory partitioning circuits includes:

a first memory partitioning circuit connected with a first address line of the address register and an input of a first memory port of the memory device; and a second memory partitioning circuit connected with a second address line of the address register and an input of a second memory port of the memory device;

and wherein the third portion of the device configuration is adapted to configure the first and second memory partitioning circuits to hold the inputs of their respective memory ports of the memory device to complementary values, thereby dividing the multiple port memory device into at least two single port memory partitions.

21. The information storage medium of claim 19, wherein at least one memory partitioning circuit of the set of memory partitioning circuits includes a third operation mode adapted to invert the value of an address line of one of the sets of address lines.

22. The information storage medium of claim 19, wherein at least one memory partitioning circuit is comprised of at least one multiplexer and an inverter gate.

23. The information storage medium of claim 19, wherein the multiple port memory device is a two port RAM device.

* * * * *